(12) United States Patent
Dennard et al.

(10) Patent No.: US 6,812,527 B2
(45) Date of Patent: Nov. 2, 2004

(54) METHOD TO CONTROL DEVICE THRESHOLD OF SOI MOSFET'S

(75) Inventors: Robert H. Dennard, New Rochelle, NY (US); Wilfried E. Haensch, Somers, NY (US); Hussein I. Hanafi, Basking Ridge, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/235,147

(22) Filed: Sep. 5, 2002

(65) Prior Publication Data

US 2004/0046207 A1 Mar. 11, 2004

(51) Int. Cl.⁷ .......................... H01L 27/01; H01L 27/12; H01L 31/0392
(52) U.S. Cl. ..................... 257/347; 257/402; 257/348; 257/351
(58) Field of Search ................................. 257/347, 402, 257/348, 350, 351, 507, 377, 384

(56) References Cited

U.S. PATENT DOCUMENTS

| | | | |
|---|---|---|---|
| 6,204,138 B1 * | 3/2001 | Krishnan et al. ........... 438/307 |
| 6,391,695 B1 * | 5/2002 | Yu ............................... 438/166 |
| 6,469,390 B2 * | 10/2002 | Chang et al. ................ 257/758 |
| 6,525,378 B1 * | 2/2003 | Riccobene .................. 257/347 |
| 2002/0072155 A1 * | 6/2002 | Liu et al. ..................... 438/151 |
| 2002/0140033 A1 * | 10/2002 | Bae et al. .................... 257/347 |

* cited by examiner

Primary Examiner—Mary Wilczewski
Assistant Examiner—Monica Lewis
(74) Attorney, Agent, or Firm—Scully, Scott, Murphy and Presser; Wan Yee Cheung, Esq.

(57) ABSTRACT

A method of forming a silicon-on-insulator (SOI) metal oxide semiconductor field effect transistor (MOSFET) device is provided in which an implanted back-gate is formed into a Si-containing layer of an SOI wafer. The implanted back-gate thus formed is capable of controlling the threshold voltage of a polysilicon-containing front-gate which is formed over a portion of the implanted back-gate region. The implanted back-gate functions as a dynamic threshold voltage control system in the SOI MOSFET device because it is suitable for use during circuit/system active periods and during circuit/system idle periods.

9 Claims, 14 Drawing Sheets

METHOD TO CONTROL DEVICE THRESHOLD OF SOI MOSFET'S

RELATED APPLICATIONS

This application is related to co-signed U.S. application Ser. No. 10/235,169 which is being filed concurrently with the present invention.

FIELD OF THE INVENTION

The present invention relates to semiconductor device fabrication, and more particularly to a method of fabricating an implanted back-gated fully depleted complementary metal oxide semiconductor (CMOS) device in which the implanted back-gate controls the threshold voltage of the front-gate device. The present invention also relates to an implanted back-gated fully depleted CMOS device comprising, among other elements, an implanted back-gate that controls the threshold voltage of the device.

BACKGROUND OF THE INVENTION

Simultaneous reduction of supply and threshold voltages for low-power silicon-on-insulator (SOI) CMOS design without suffering performance losses will eventually reach the limit of diminishing returns as static power dissipation becomes a significant portion of the total power equation. In order to meet the opposing requirements of high-performance during circuit/system active periods, and low-power, during circuit/system idle periods, a dynamic threshold voltage control scheme is needed.

For SOI metal oxide field effect transistors (MOSFETs), there are two modes of operation: 1) fully depleted, and 2) partially depleted channel region. In conventional strongly fully depleted SOI devices, the silicon film thickness is usually less than or equal to half the depletion width of the bulk device. The surface potentials at the front and back interfaces are strongly coupled to each other and capacitively coupled to the front-gate and substrate through the front-gate dielectric and the buried oxide, respectively. Therefore, the potential throughout the silicon film, and hence the charge, is determined by the bias conditions on both the front-gate and the substrate. By replacing the substrate with a back-gate, the device becomes a dual-gated device.

The fully depleted design is unique to SOI because the front-gate and the back-gate both have control of the charge in the silicon film. In the strongly partially depleted device, the back-gate or the substrate has no influence on the front surface potential. In the middle regime, the device is nominally partially depleted and can become fully depleted by applying bias, thus, coupling of the front and back surface potentials still occurs.

To date, no adequate dynamic threshold voltage control schemes are present in conventional SOI MOSFET devices; therefore, as these devices are continually being scaled down to smaller sizes, the devices will become extremely leaky when operating under low-power conditions, i.e., when the devices are idle.

In view of the state of the art mentioned above, there is a continued need for providing a SOI MOSFET device that includes a dynamic threshold voltage control scheme that works under circuit/system active periods, as well as circuit/system idle periods.

SUMMARY OF THE INVENTION

The present invention is directed to a SOI MOSFET device that includes a dynamic threshold voltage control scheme, which is suitable for both high-performance, i.e., circuit/system active periods, and low-power, i.e., circuit/system idle periods, applications. Specifically, the present invention provides a SOI MOSFET device comprising an implanted back-gate region which controls the threshold voltage of the front-gate. NMOS and PMOS back-gates are also present which are switched independently of each other and the back-gate. The front-gate threshold voltage may be controlled over the range between strong accumulation and strong inversion of the back interface.

In the device aspect of the present invention, a SOI MOSFET device is provided that comprises:

a silicon-on-insulator substrate comprising a first Si-containing layer located atop a buried oxide layer, said Si-containing layer including an implanted back-gate region present therein;

a second Si-containing layer located atop said first Si-containing layer, wherein a portion of the second Si-containing layer serves as a body region for a MOSFET; and a polysilicon gate located atop said body region.

The present invention also provides a method of fabricating the above-mentioned SOI MOSFET device. The inventive method utilizes processing steps that are compatible with conventional CMOS processes. Specifically, the method of the present invention comprises the steps of:

providing an initial SOI wafer which includes at least a first Si-containing layer located atop a buried oxide region, said first Si-containing layer having an implanted back-gate region located therein;

providing a second SOI wafer having at least an oxide layer formed atop a second Si-containing layer;

bonding said SOI wafers together to provide a bonded structure in which the oxide layer of the second wafer; is bonded to the first Si-containing layer of the initial SOI wafer;

exposing the second Si-containing layer of the bonded structure;

converting a portion of said exposed second Si-containing layer into a body region; and forming a gate dielectric and a polysilicon gate atop said body region.

Additional BEOL processing steps, as described herein below, can also be performed following polysilicon gate formation.

DETAILED DESCRIPTION OF THE INVENTION

Figure 1:
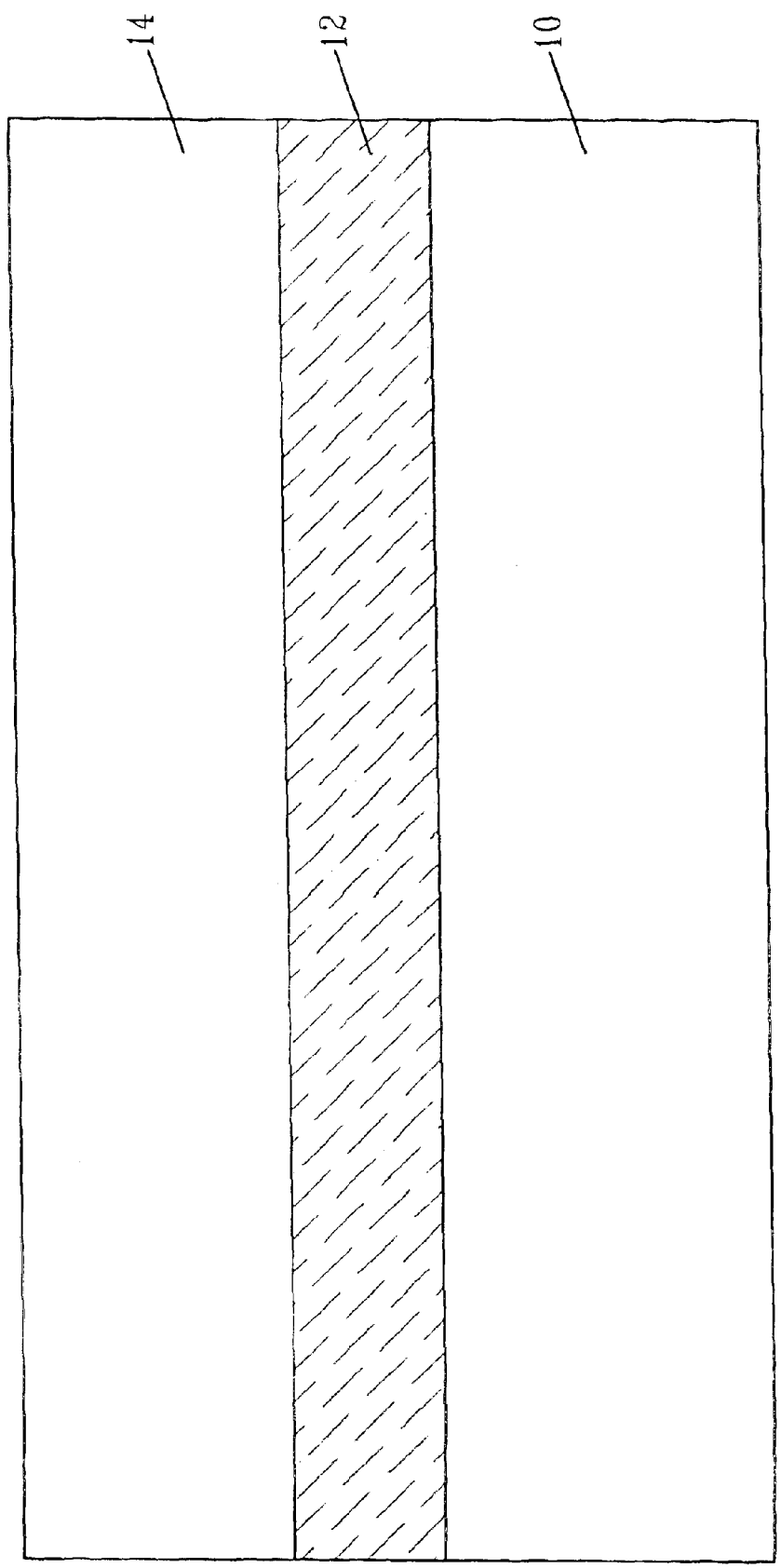
FIGS. 1–15 are pictorial representations (through cross-sectional views) illustrating the basic processing steps that are employed in the present invention for fabricating a SOI MOSFET device comprising a back-gate which controls the threshold voltage of the front-gate.

The present invention, which provides a SOI MOSFET device comprising a back-gate that controls the threshold voltage of the front-gate as well as a method of fabricating such a device, will now be described in greater detail by referring to the drawings that accompany the present application.

FIG. 1 illustrates an initial SOI substrate that can be employed in the present invention. It is noted that in the present application the terms "SOI substrate" and "SOI wafer" are interchangeably used. Specifically, the initial SOI substrate or wafer of FIG. 1 comprises buried oxide layer 12 which electrically isolates Si-containing substrate 10 from Si-containing layer 14. It is noted that Si-containing layer 14 is the SOI layer in which active device regions can be formed therein. The term "Si-containing" as used herein denotes a material that includes at least silicon. Illustrative examples of such Si-containing materials include, but are not limited to: Si, SiGe, SiC, SiGeC, Si/Si, Si/SiC, and Si/SiGeC. Buried oxide region 12 may be a continuous buried oxide region, as is shown in FIG. 1, or it may be a non-continuous, i.e., patterned, buried oxide region (not shown). The non-continuous buried oxide regions are discrete and isolated regions or islands that are surrounded by Si-containing layers, i.e., layers 10 and 14.

It is noted that at this point of the present invention Si-containing layer 14 is lightly doped with an N or P-type dopant. The term "lightly doped" is used herein to denote a dopant concentration of about 1E14 to about 5E15 atoms/cm$^3$, with a dopant concentration of about 2E15 atoms/cm$^3$ being more highly preferred.

The SOI substrate may be formed utilizing conventional SIMOX (separation by ion implantation of oxygen) processes well-known to those skilled in the art, as well as the various SIMOX processes mentioned in co-assigned U.S. patent application Ser. No. 09/861,593, filed May 21, 2001; Ser. No. 09/861,594, filed May 21, 2001; Ser. No. 09/861,590, filed May 21, 2001; Ser. No. 09/861,596, filed May 21, 2001; and Ser. No. 09/884,670, filed Jun. 19, 2001 as well as U.S. Pat. No. 5,930,634 to Sadana, et al., the entire contents of each are incorporated herein by reference. Alternatively, the SOI substrate material may be made using other conventional processes including, for example, a thermal bonding and cutting process.

In addition to the above techniques, the initial SOI substrate employed in the present invention may be formed by deposition processes as well as lithography and etching (employed when fabricating a patterned substrate). Specifically, the initial structure may be formed by depositing an oxide film atop a surface of a Si-containing substrate, via a conventional deposition or thermal growing process; optionally patterning the oxide film by employing conventional lithography and etching; and thereafter forming a Si-containing layer atop the oxide layer using a conventional deposition process including, for example, chemical vapor deposition (CVD), plasma-assisted CVD, sputtering, evaporation, chemical solution deposition or epitaxial Si growth.

The thickness of the various layers of the initial SOI substrate may vary depending on the process used in making the same. Typically, however, Si-containing layer 14 has a thickness of from about 100 to about 200 nm. In the case of buried oxide layer 12, that layer may have a thickness of from about 100 to about 400 nm. The thickness of the Si-containing substrate layer, i.e., layer 10, is inconsequential to the present invention. It is noted that the thicknesses provided above are exemplary and by no ways limit the scope of the present invention.

Next, pad oxide layer 16 is formed atop a surface of Si-containing layer 14 utilizing a conventional thermal growing process. Alternatively, pad oxide layer 16 may be formed by a conventional deposition process including, but not limited to: chemical vapor deposition (CVD), plasma-assisted CVD, chemical solution deposition, sputtering and evaporation. The thickness of the pad oxide layer may vary depending on the technique used in fabricating the same. Typically, however, pad oxide layer 16 has a thickness of from about 5 to about 15 nm.

Hardmask 18 is then formed atop pad oxide layer 16 utilizing a conventional deposition process such as CVD, plasma-assisted CVD, sputtering, chemical solution deposition, and evaporation. The hardmask is composed of SiN, SiON or other like materials that are capable of functioning as a hardmask as well as a polish stop layer. The thickness of hardmask 18 is not critical to the present invention, but typically hardmask 18 has a thickness of from about 50 to about 100 nm. The resultant structure including pad oxide layer 16 and hardmask 18 is shown, for example, in FIG. 2. It is noted that in FIG. 2, as well as the remaining drawings, Si-containing substrate 10 of the initial SOI wafer has been omitted for clarity. The Si-containing substrate is intended to be present however in each of the drawings. The thickness of layer 14 illustrated in FIG. 2 has been shown to be thicker than the original thickness of layer 14 in FIG. 1 for clarity.

Figure 2:
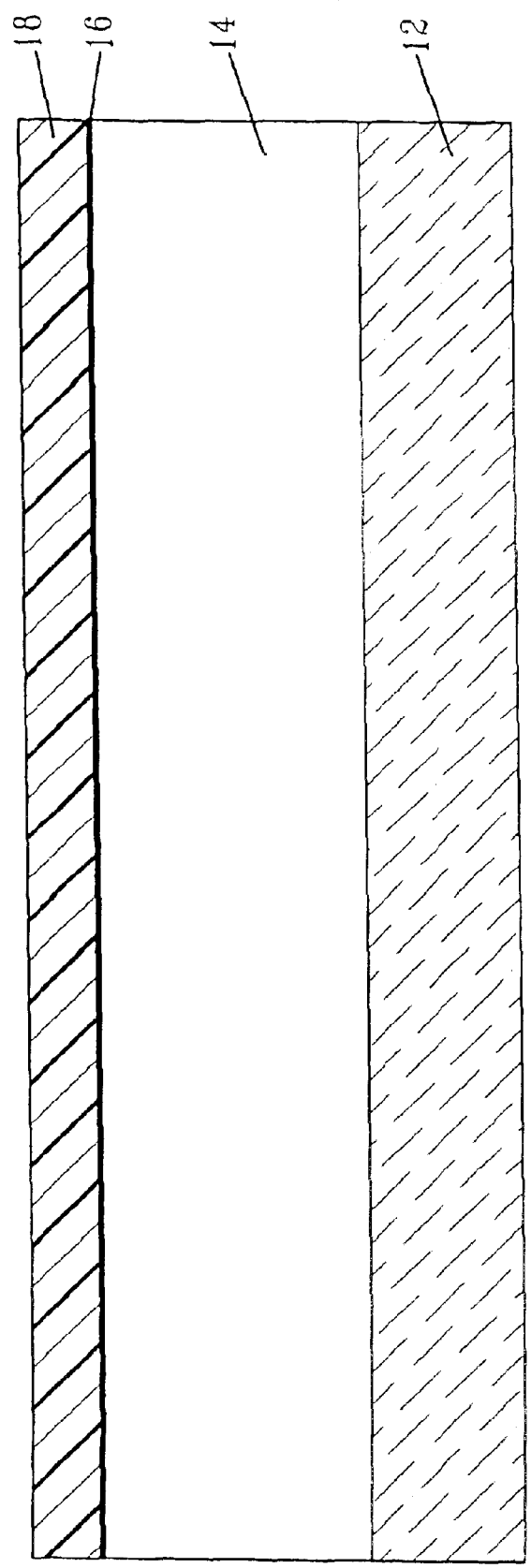
Figure 3:
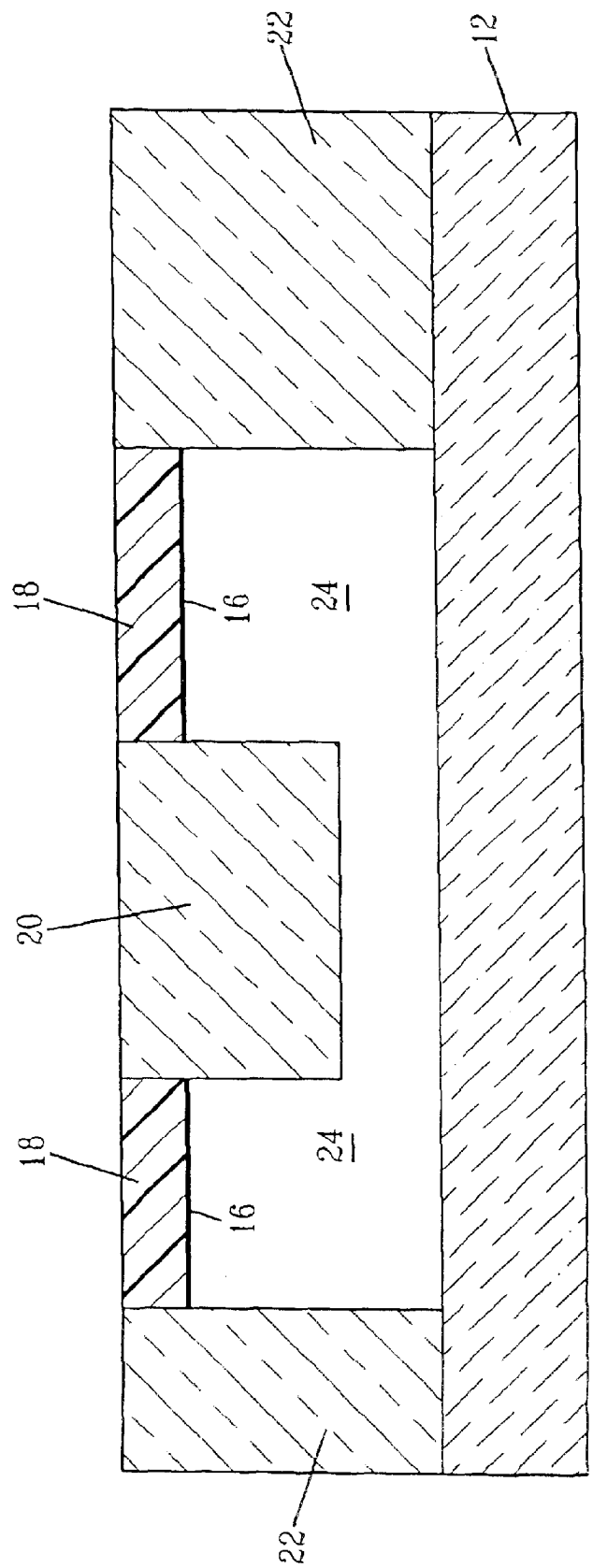

FIG. 3 shows the structure that is formed after various isolation regions including shallow trench isolation region 20 and deep trench isolation regions 22 are formed into the structure shown in FIG. 2. As shown, the shallow trench isolation region is formed through hardmask 18, pad oxide layer 16 and into a portion of Si-containing layer 14. The deep trench isolation regions, on the other hand, are formed through hardmask 18, pad oxide layer 16, and Si-containing layer 14, stopping on, or in, an upper surface of buried oxide region 12.

It is noted that the actual number of shallow trench isolation regions and deep trench isolation regions may exceed the number shown in the drawings. In such circumstances, two nearby deep trench isolation regions will flank each shallow trench isolation region present in the structure.

The trench isolation regions (both shallow isolation region 20 and deep trench isolation regions 22) are first formed by utilizing conventional lithography and etching. The lithography step used in forming the trenches of the isolation regions comprises the steps of: applying a photoresist (not shown) to the exposed surface of hardmask 18, exposing the photoresist to a pattern of radiation, and developing the pattern into the exposed photoresist utilizing a conventional resist developer. The etching step, which may be conducted in a single step or multiple etching steps, includes the use of a conventional dry etching process such as reactive-ion etching, plasma etching or ion beam etching; chemical wet etching; or a combination thereof. The etching step forms deep and shallow trenches into the structure which will be subsequently filled with an insulating material. Note that the photoresist is typically removed after the pattern has been transferred into the hardmask.

The shallow trench isolation regions typically have a trench depth, as measured from the upper surface of Si-containing layer 14, of about 130 nm or less, while the deep trench isolation regions typically have a trench depth of about 140 nm or greater.

After the trenches have been formed, the structure is subjected to an optional oxidation process which forms a thin liner (not separately labeled) on the exposed trench sidewalls that are composed of a Si-containing material. The trenches (with or without the liner) are filled with a dielectric material such as TEOS (tetraethylorthosilicate) utilizing a conventional deposition process such as CVD or plasma-assisted CVD and thereafter the structure is planarized utilizing a conventional planarization process such as chemical-mechanical polishing (CMP) or grinding, stopping on the upper surface of hardmask 18. An optional densification step may be performed after filling the trench, but prior to planarization.

The remaining hardmask present on the structure shown in FIG. 3 is then removed utilizing an etching process that is highly selective in removing nitride as compared to oxide. Back-gate region 24 is then formed into the Si-containing layer by ion implanting and annealing. For NMOS devices, the back-gate is formed by ion implanting an N, or more preferably a P type dopant into the previously lightly doped P⁻ Si-containing layer. For PMOS devices, P, or more preferably N type dopants are ion implanted into the previously lightly doped P⁻ Si-containing layer. In each case, the back-gate region is formed by ion implanting a higher dopant concentration into the previously lightly doped region.

Figure 4:
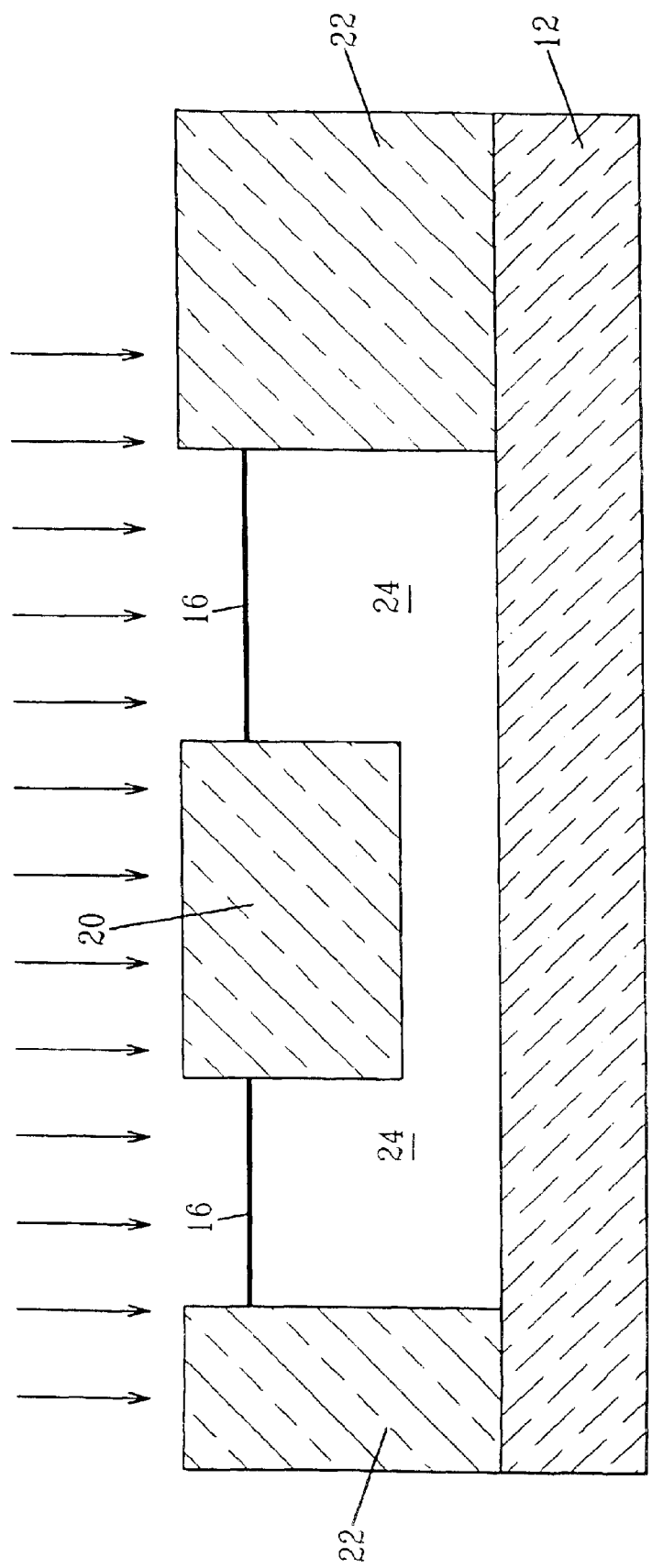

The ion implantation (represented by the arrows in FIG. 4) is performed utilizing conventional techniques well-known to those skilled in the art, whereas annealing is performed under conditions that will diffuse and activate the dopant regions. Specifically, annealing is conducted in an inert gas ambient such as Ar, $N_2$ or He at a temperature of about 800° C. or greater for a time period of about 5 seconds or greater. The structure, which is formed after removal of the hardmask and formation of implanted back-gate region 24, is shown, for example, in FIG. 4.

Figure 5:
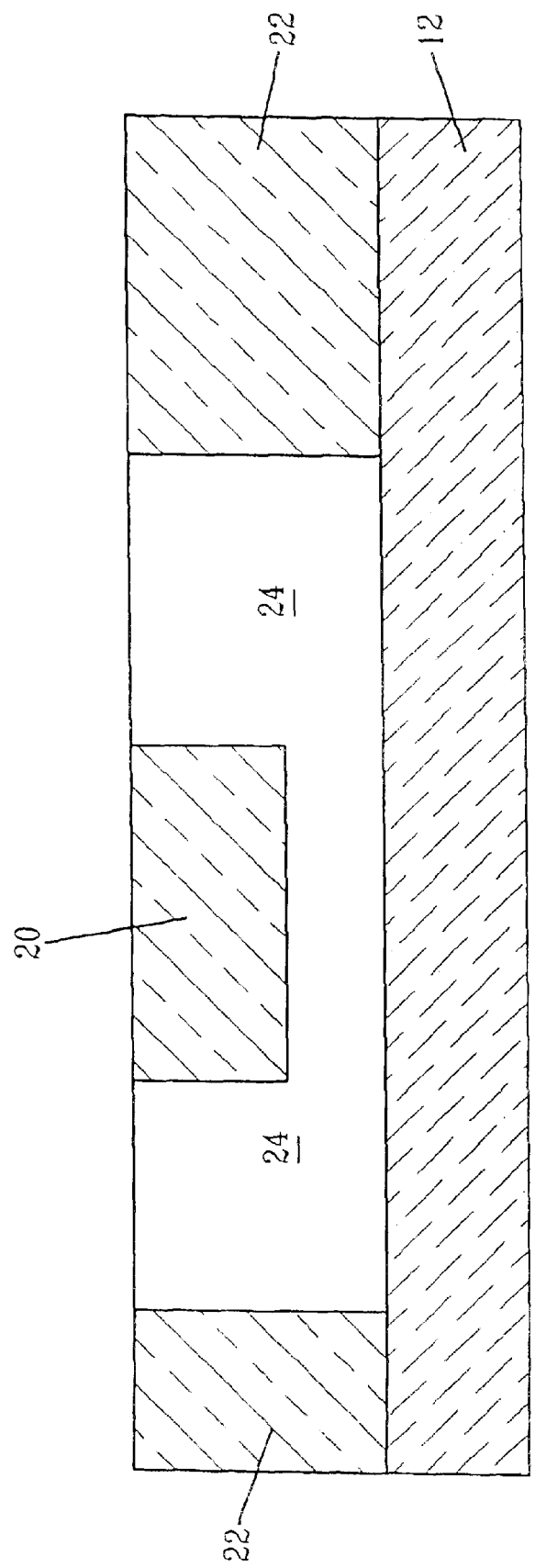

FIG. 5 illustrates the structure that is formed after wafer planarization and removal of pad oxide layer 16. Specifically, the wafer planarization includes CMP or grinding, which is stopped when the process reaches the upper surface of implanted back-gate region 24. An HF dip process may be used to ensure that oxide layer 16 has been removed from the structure.

Figure 6:
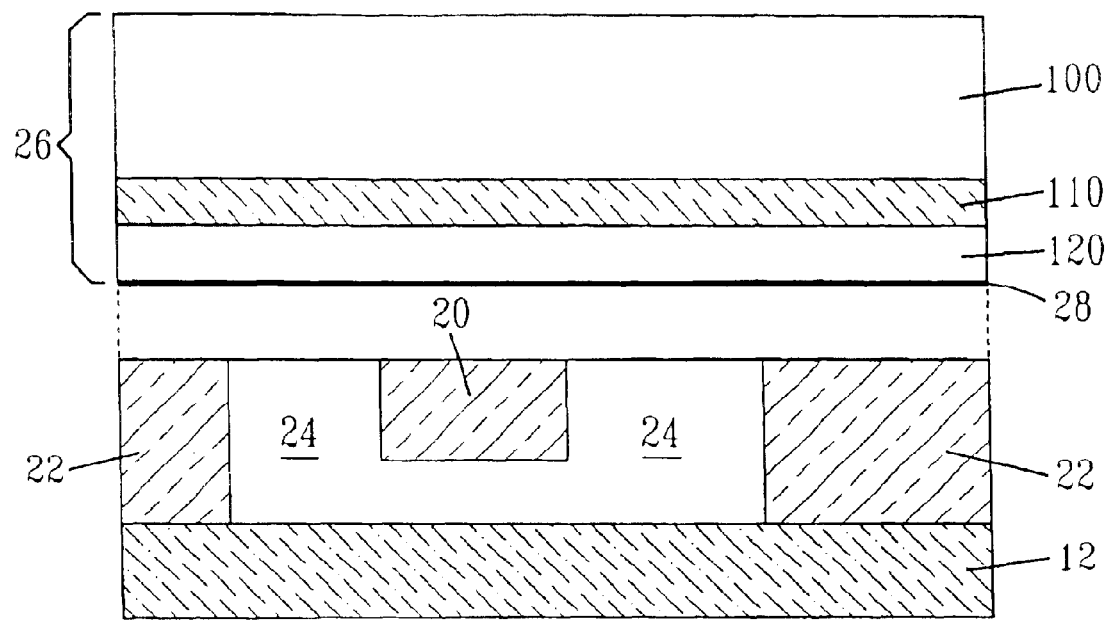

A second SOI wafer (designated as element 26 in FIG. 6) comprising Si-containing substrate 100, buried oxide layer 110, Si-containing layer 120 and oxide layer 28 is then positioned such that oxide layer 28 of the second SOI wafer is facing the Si-containing layer, i.e., implanted back-gate region 24 of the initial SOI wafer. Note that the elements of the second SOI wafer are the same as the elements present in the initial SOI wafer. FIG. 6 illustrates the positioning of the SOI wafers prior to contacting and bonding. Note that oxide layer 28 of second SOI wafer 26 is formed by a conventional thermal growing process and that the oxide layer has a thickness of from about 1.5 to about 10 nm. In subsequent drawings, oxide layer 28 serves as the back-gate dielectric for the implanted back-gate region.

Figure 7:
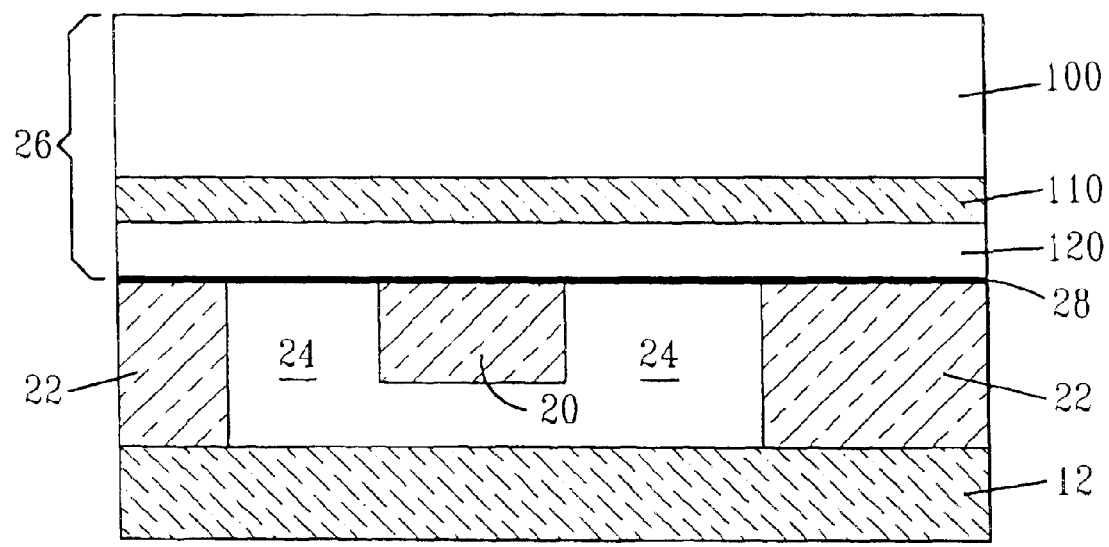

The two wafers shown in FIG. 6 are then brought into intimate contact with each other and then the contacted wafers are bonded together so as to provide the bonded structure shown in FIG. 7. In one embodiment, the bonding step of the present invention includes heating the two wafers at a temperature of from about 900° to about 1100° C. for a time period of from about 1.5 hours to about 2.5 hours. In one preferred embodiment of the present invention, the wafers are bonded together at a temperature of about 1050° C. for a time period of about 2 hours. It should be noted that when such a high-temperature bonding process is performed, the dopants implanted into region 24 should be deep so as to avoid outdiffusion of dopants from that layer into lightly doped region 120.

In another embodiment of the cat invention, the bonding step is performed utilizing the room-temperature bonding process described in co-assigned U.S. application Ser. No. 10/235,169 filed Jul. 24, 2002, the entire content of which is being incorporated herein by reference. The term "room temperature bonding process" denotes a bonding process that is carried out at a temperature about 18° to about 27° C., with a temperature of from about 20° to about 25° C. being more highly preferred. The room temperature bonding process is typically carried out in an inert ambient such as He, $N_2$ or Ar and an external force may be applied to the structure to aide in the bonding process.

Figure 8:
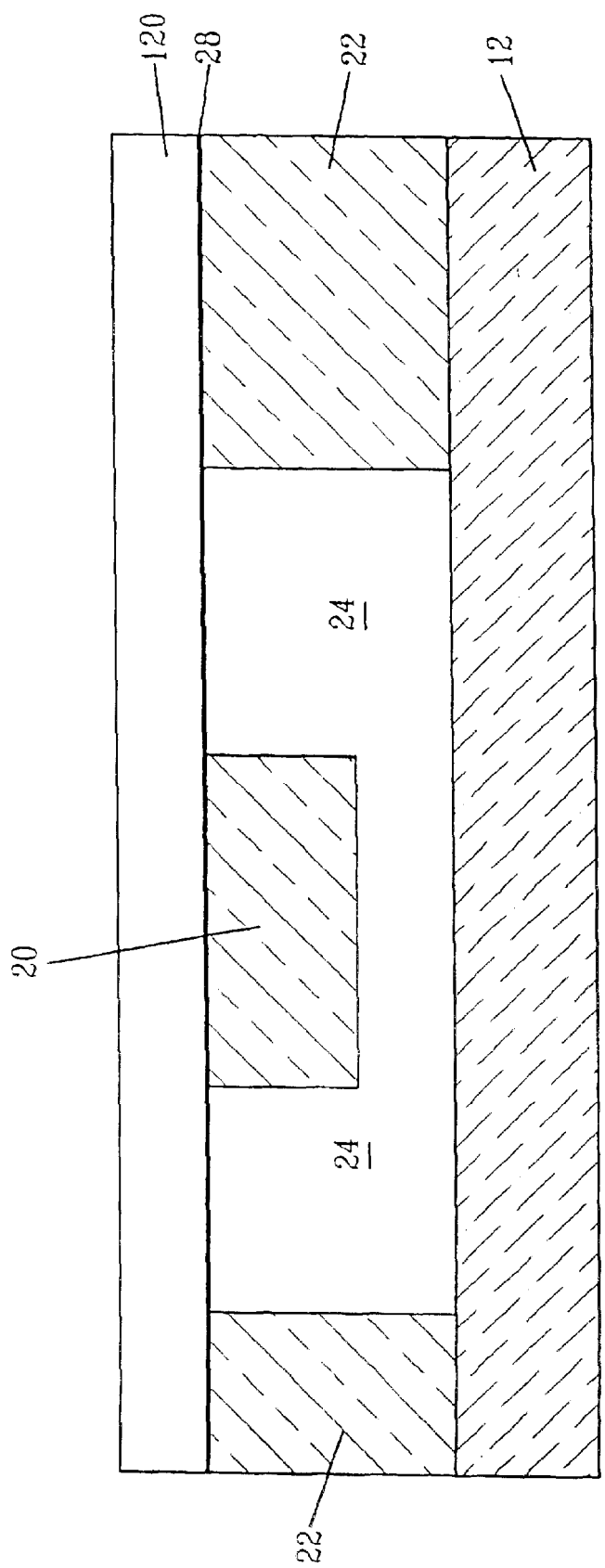

Following the bonding of the two wafers, Si-containing substrate 100 and buried oxide region 110 of the second wafer are removed, stopping on a surface of Si-containing layer 120. The resultant structure that is formed after this removal step is shown, for example, in FIG. 8. Specifically, the removal of the Si-containing substrate and the buried oxide layer of the second wafer are achieved utilizing conventional processes that are well-known in the art. For example, Si-containing substrate 100 and buried oxide region 110 of the second wafer may be removed utilizing a single polishing step such as CMP or grinding, or alternatively, the various layers are removed utilizing distinct and separate removal processing steps. The use of distinct, and separate removal processes is preferred herein since it provides for more selectively and ensures that the removal process stops on Si-containing layer 120.

When distinct, and separate removal processes are employed in the present invention, Si-containing substrate 100 of the second wafer is first removed, stopping on buried oxide region 110, by utilizing a CMP process which has a high selectivity for removing a Si-containing material as compared with oxide. Next, an oxidation process may optionally be performed to ensure that only oxide remains on the exposed surface of the bonded wafer. After removal of Si-containing substrate 100, and optionally performing the oxidation step, a conventional chemical wet etching process that has a high-selectivity for removing oxide as compared to Si-containing material is employed. For example, an HF etching process can be employed in the present invention for removing buried oxide layer 110 from the bonded structure. Note that the various removal processes expose Si-containing layer 120 of the second wafer.

Figure 9:
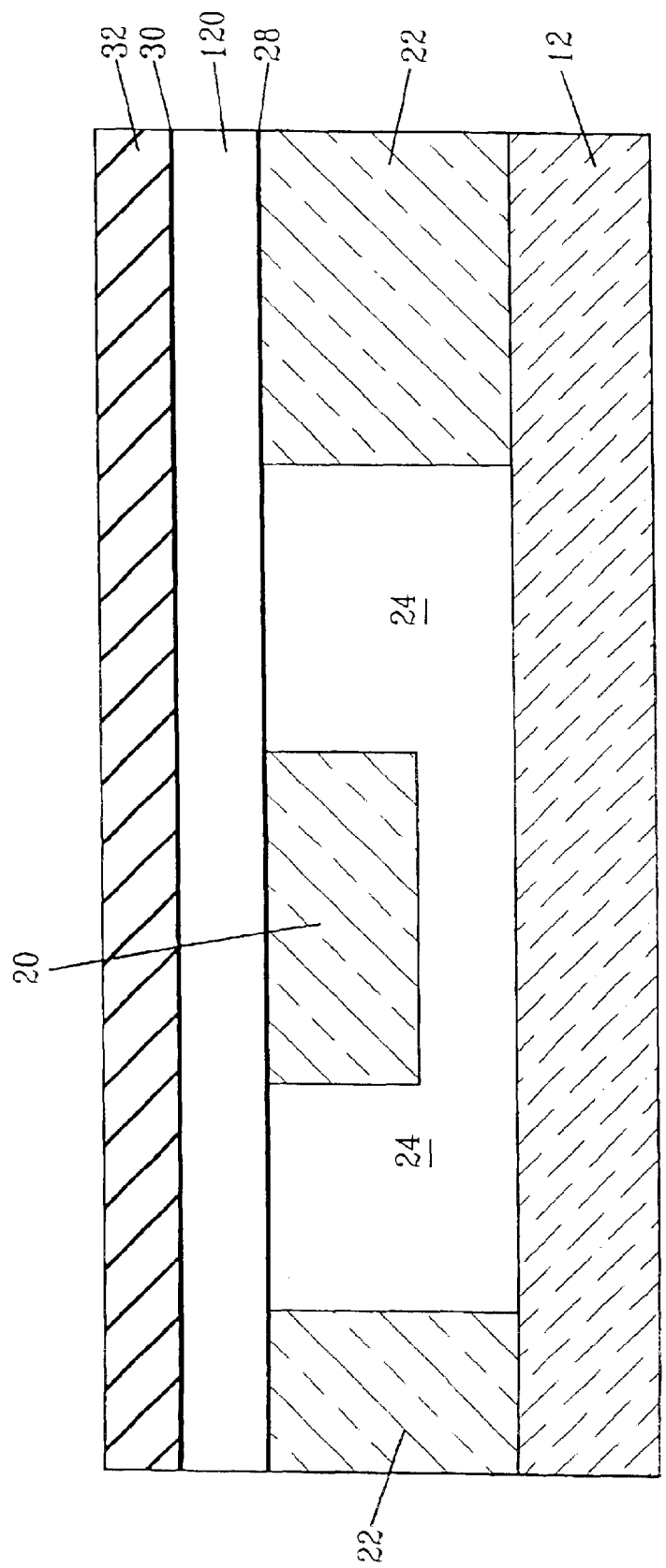

FIG. 9 shows the resultant structure that is formed after sacrificial oxide layer 30 and nitride layer 32 are formed atop the exposed surface of Si-containing layer 120. The sacrificial oxide layer 30 may be formed by a thermal oxidation process, or alternatively sacrificial oxide layer 30 can be formed by a conventional deposition process such as CVD or plasma-assisted CVD. The thickness of the sacrificial oxide layer is not critical to the present invention, but typically, sacrificial oxide layer 30 has a thickness of from about 3 to about 10 nm.

Nitride layer 32 is formed atop sacrificial oxide layer 30 utilizing a conventional deposition process such as CVD or plasma-assisted CVD. The thickness of nitride layer 32 is also not critical to the present invention, but typically nitride layer 32 has a thickness of from about 30 to about 80 nm.

Figure 10:
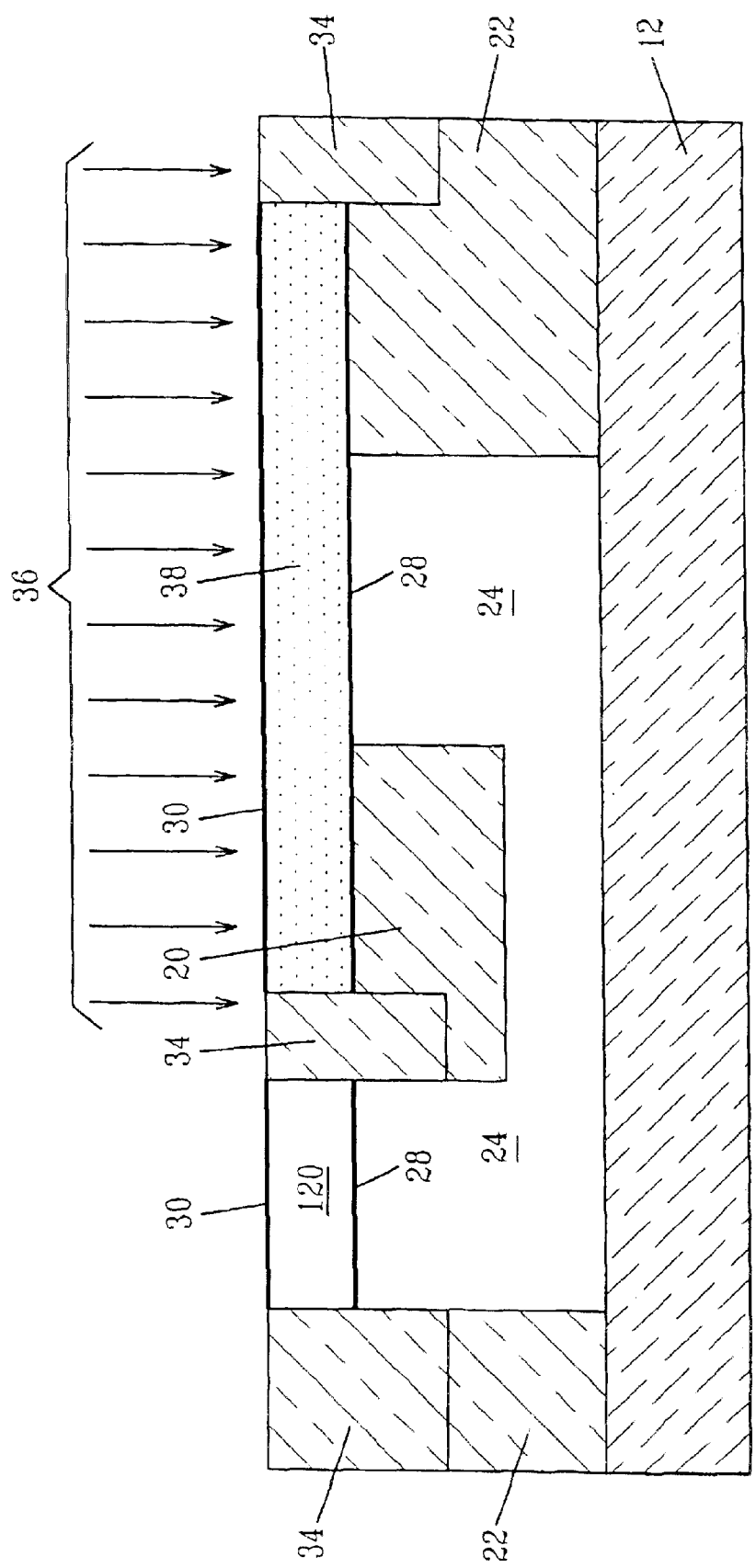

Next, top trench isolation regions 34 are formed into the structure shown in FIG. 9 utilizing the technique that was previously used in forming the deep trench isolation regions and the shallow trench isolation regions, See FIG. 10. Note that at least one of the edges of the top trench isolation regions are aligned with one of the edges of the previously formed isolation trench regions. Following the formation of the top trench isolation regions, nitride layer 32 is removed from the structure utilizing a wet etch process, such as hot phosphoric acid. A timed HF etching process may be used to remove any part of top trench isolation region 34 that is not coplanar with sacrificial oxide layer 30.

FIG. 10 also shows ions 36 being implanted into portions of Si-containing layer 120. The region where ions 36 are being implanted becomes body region 38 of the device. A masked ion implantation process utilizing standard implantation conditions is employed in forming body region 38. Following body implantation, a conventional annealing process which is conducted in an inert ambient is performed to activate the body region. Although various annealing temperatures and times may be employed in the present invention in activating the body region, it is preferred to anneal in Ar at a temperature of about 1000° C. for about 5 seconds.

Figure 11:
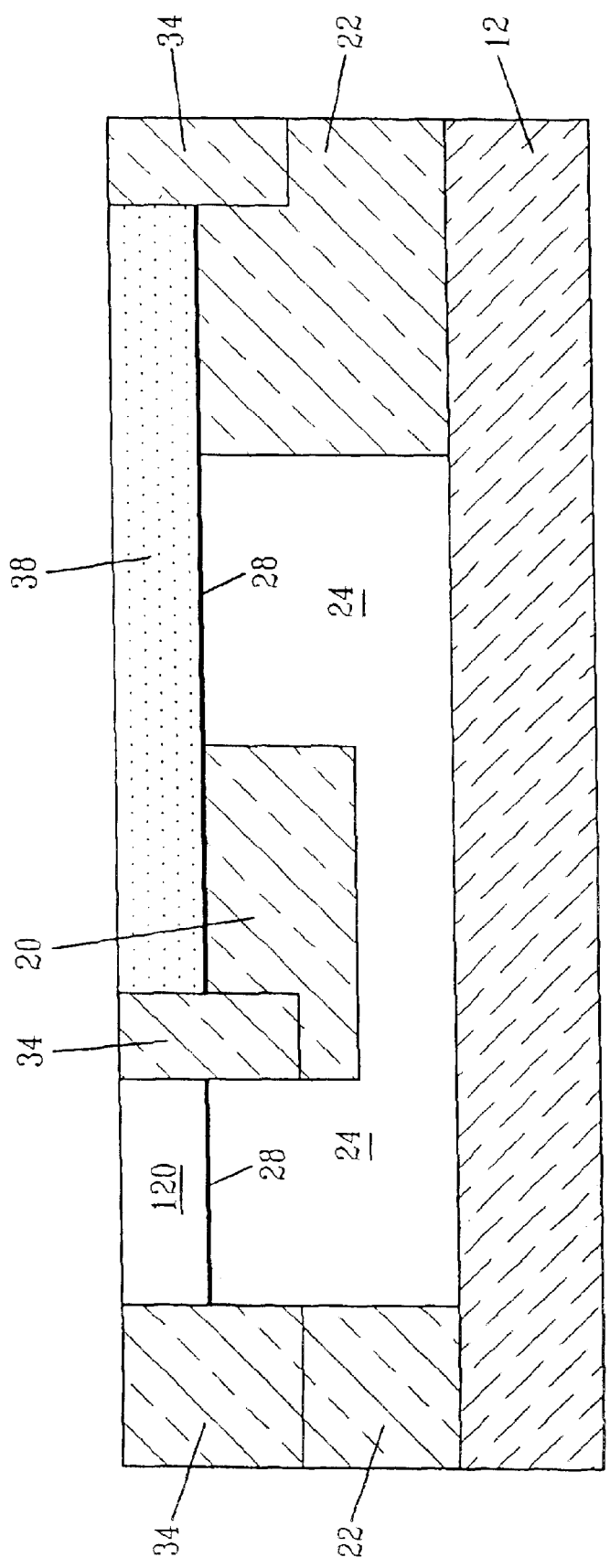

FIG. 11 shows the structure that is formed after removing sacrificial oxide layer 30 from the structure so as to expose underlying body region 38 and Si-containing layer 120. Specifically, the sacrificial oxide layer is removed from the structure utilizing a conventional wet etching process wherein a chemical etchant that is highly selective in removing an oxide is employed. For example, HF can be used to remove the sacrificial oxide layer from the structure.

Next, gate dielectric 40 and polysilicon gate 42 are formed on the exposed Si-containing surface which includes body region 38. Gate dielectric 40 is formed on the exposed surfaces of body region 38 as well as Si-containing layer 120 utilizing a conventional thermal growing process. The gate dielectric, which serves as the front-gate dielectric, is a thin layer having a thickness of from about 1 to about 5 nm. The gate dielectric may be composed of a conventional oxide such as, but not limited to: $SiO_2$, $Al_2O_3$, $Ta_2O_3$, $TiO_2$, and perovskite-type oxides.

Figure 12:
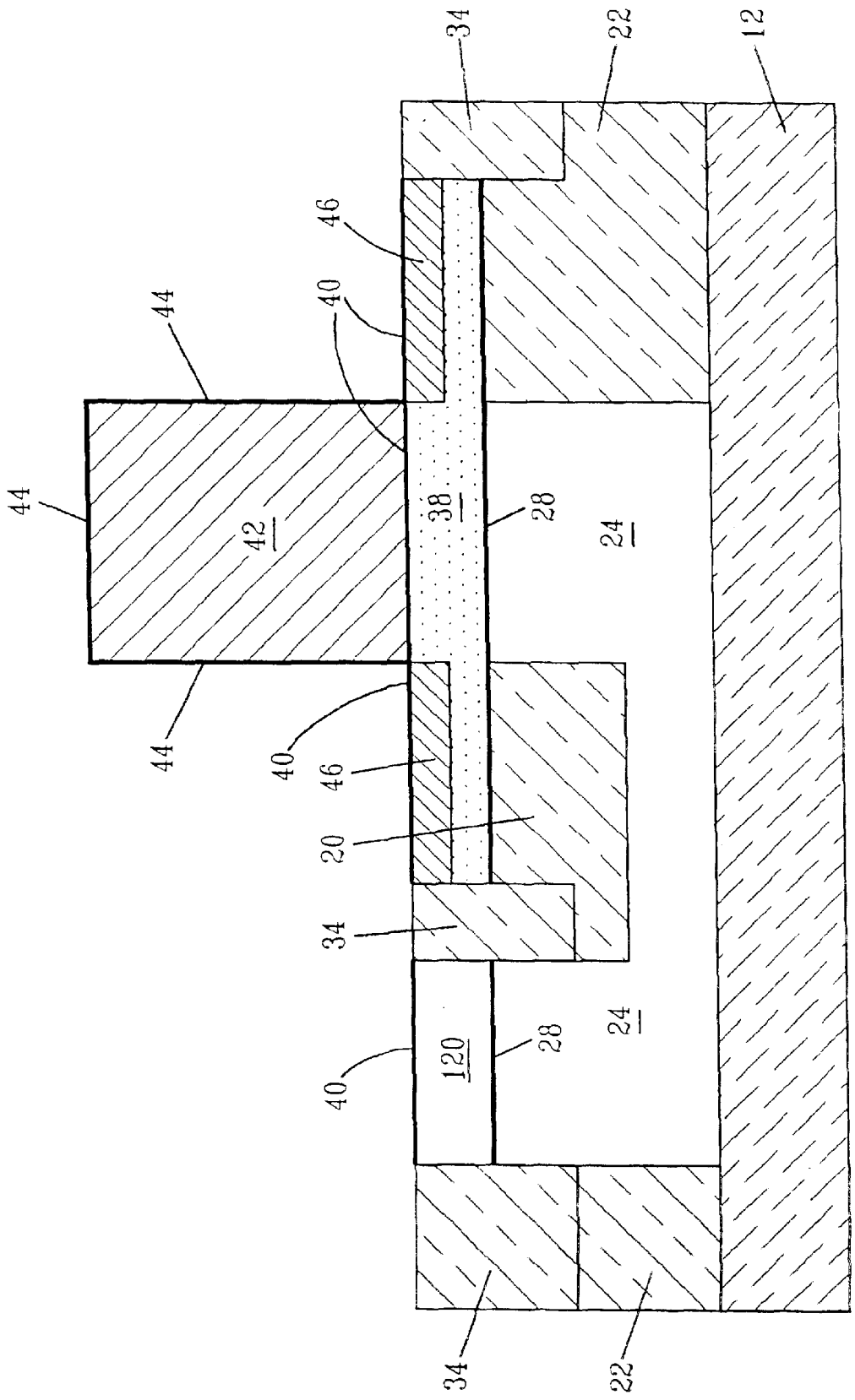

Following formation of the gate dielectric, polysilicon gate 42 (which functions as the front-side gate) is formed over portions of the gate dielectric that overlays body region 38, See FIG. 12. The gate which is composed of doped polysilicon is formed by first depositing polysilicon atop the gate dielectric utilizing a conventional deposition process and then lithography and etching is used in forming the final gate structure. The polysilicon is either doped in-situ during the deposition process, or alternatively, the polysilicon gate can be doped after deposition using conventional ion implantation and annealing. In some embodiments of the present invention, the polysilicon gate doping can be delayed until formation of the source/drain regions.

The polysilicon gate is then subjected to a gate re-oxidation process which is capable of forming oxide liner 44 about the gate's vertical sidewalls and on its top horizontal surface. The re-oxidation is performed in an oxidizing ambient such as $O_2$ or air at a temperature of about 800° C. or greater for a time period of about 5 minutes or less.

Following the re-oxidation process, source/drain extension regions 46 are formed in body region 38 utilizing conventional ion implantation and annealing. An optional halo implant region, not shown, may also be formed. Although annealing may be conducted utilizing various conditions, it is preferred to anneal the source/drain extension implants in Ar at a temperature of about 900° C. for a time period of 5 seconds.

Figure 13:
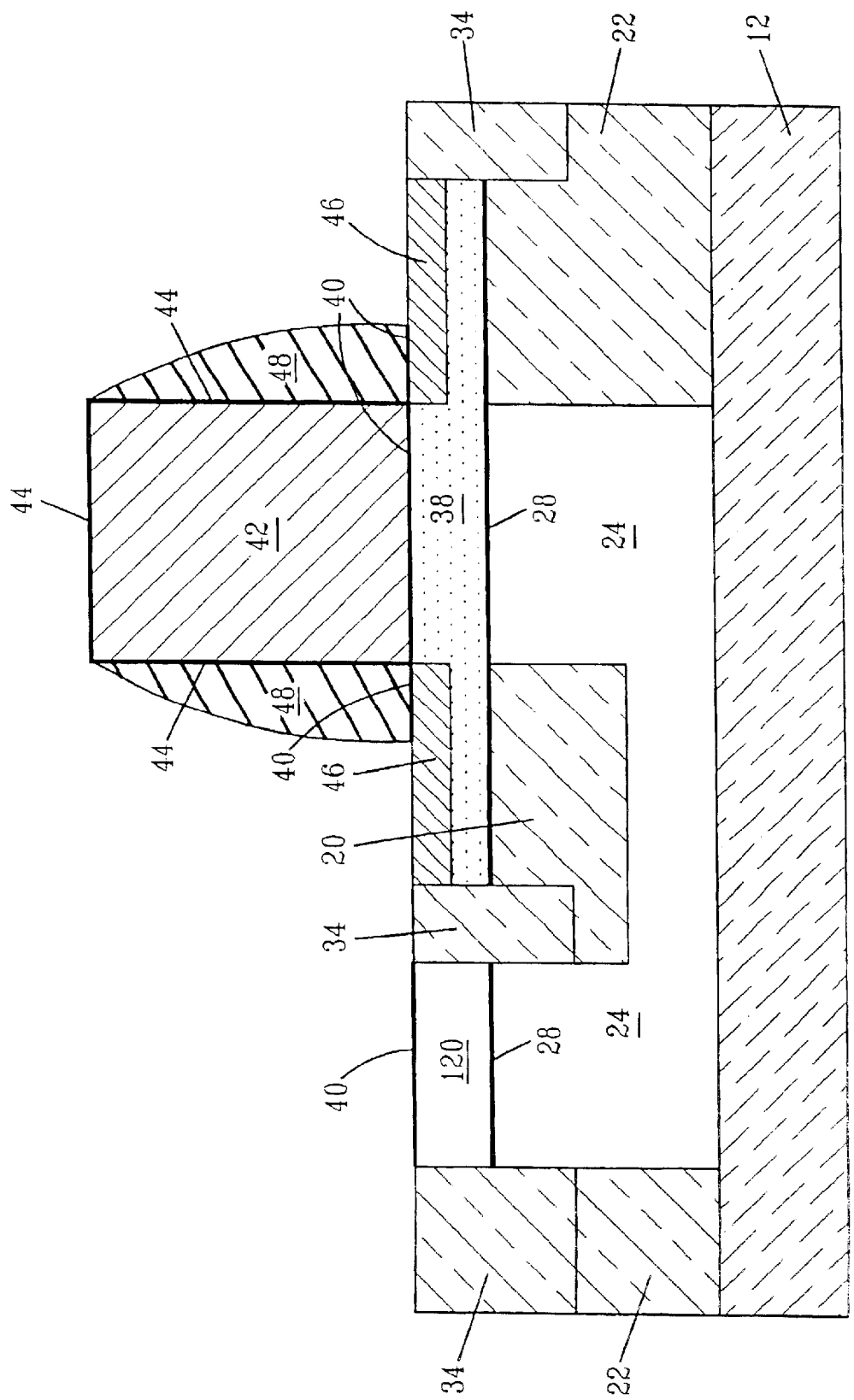

Spacers 48 which may be composed of a nitride, oxynitride or a combination thereof, are then formed about the vertical sidewalls of the polysilicon gate. The spacers are formed by deposition of an insulating material followed by etching. FIG. 13 shows the resultant structure having spacers 48 formed about the vertical sidewalls of the polysilicon gate.

After spacer formation, source/drain regions 50 are formed into body region 38 abutting each spacer utilizing a conventional ion implantation and annealing process. Although various annealing conditions can again be employed, it is preferred to conduct the annealing in Ar at a temperature of about 1000° C. for a time period of about 5 seconds.

Next, the gate dielectric abutting the spacers is removed from the structure utilizing an etching process that is highly selective in removing gate dielectric, e.g., an oxide, as compared to polysilicon or spacer material. Note that this etching step exposes the source/drain regions that were previously formed into the body region of the device.

Figure 14:
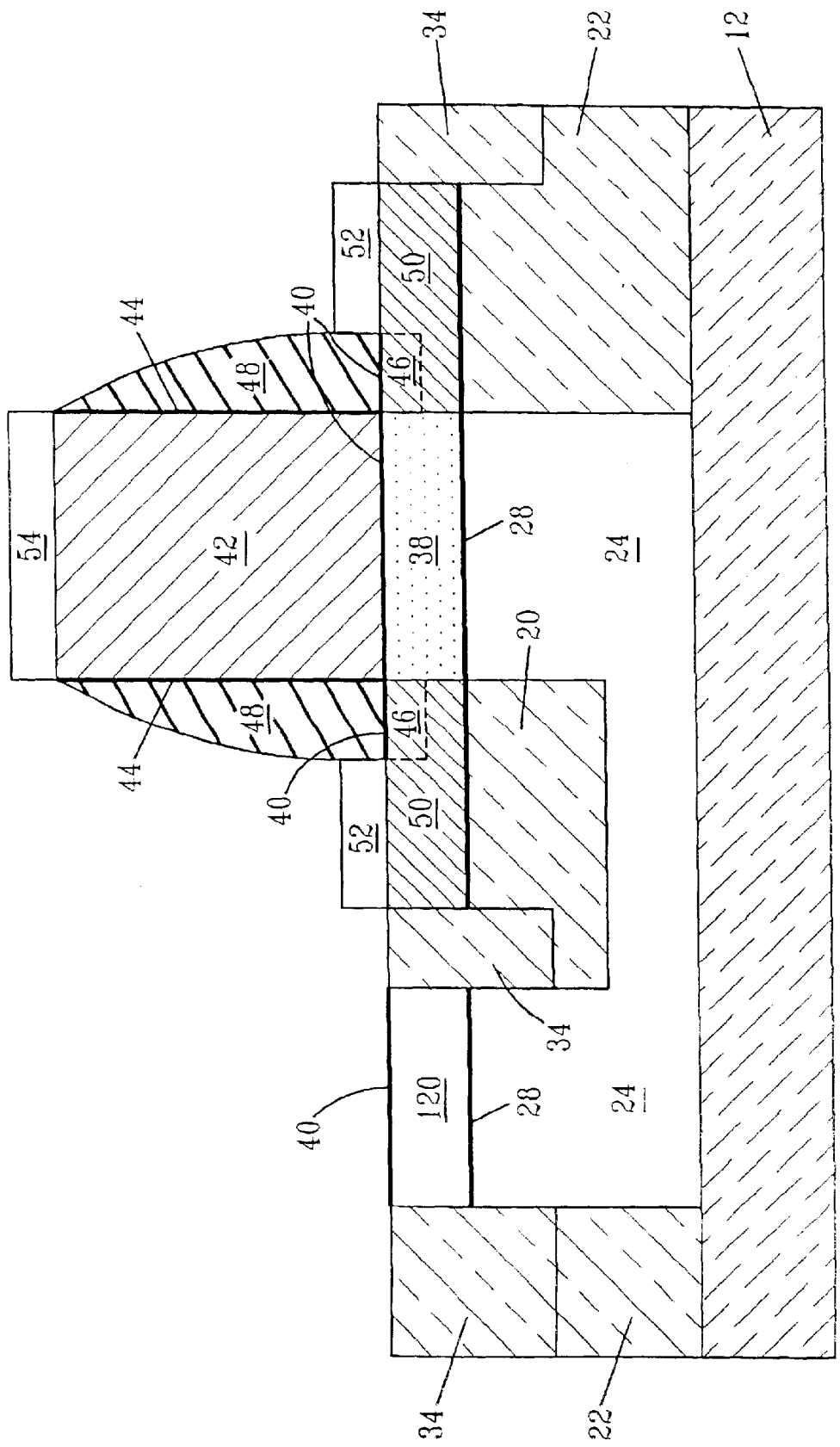

After exposing the source/drain regions, raised source/drain regions 52, as depicted in FIG. 14, are formed utilizing conventional processes well-known to those skilled in the art. Specifically, the raised/source drain regions are formed by depositing a layer of epi polysilicon or Si on the exposed source/drain regions, and doping the thus deposited epi Si or Si layer by ion implanting and annealing. Note that a layer of epi Si or Si (denoted by reference numeral 54) is formed atop the gate.

Figure 15:
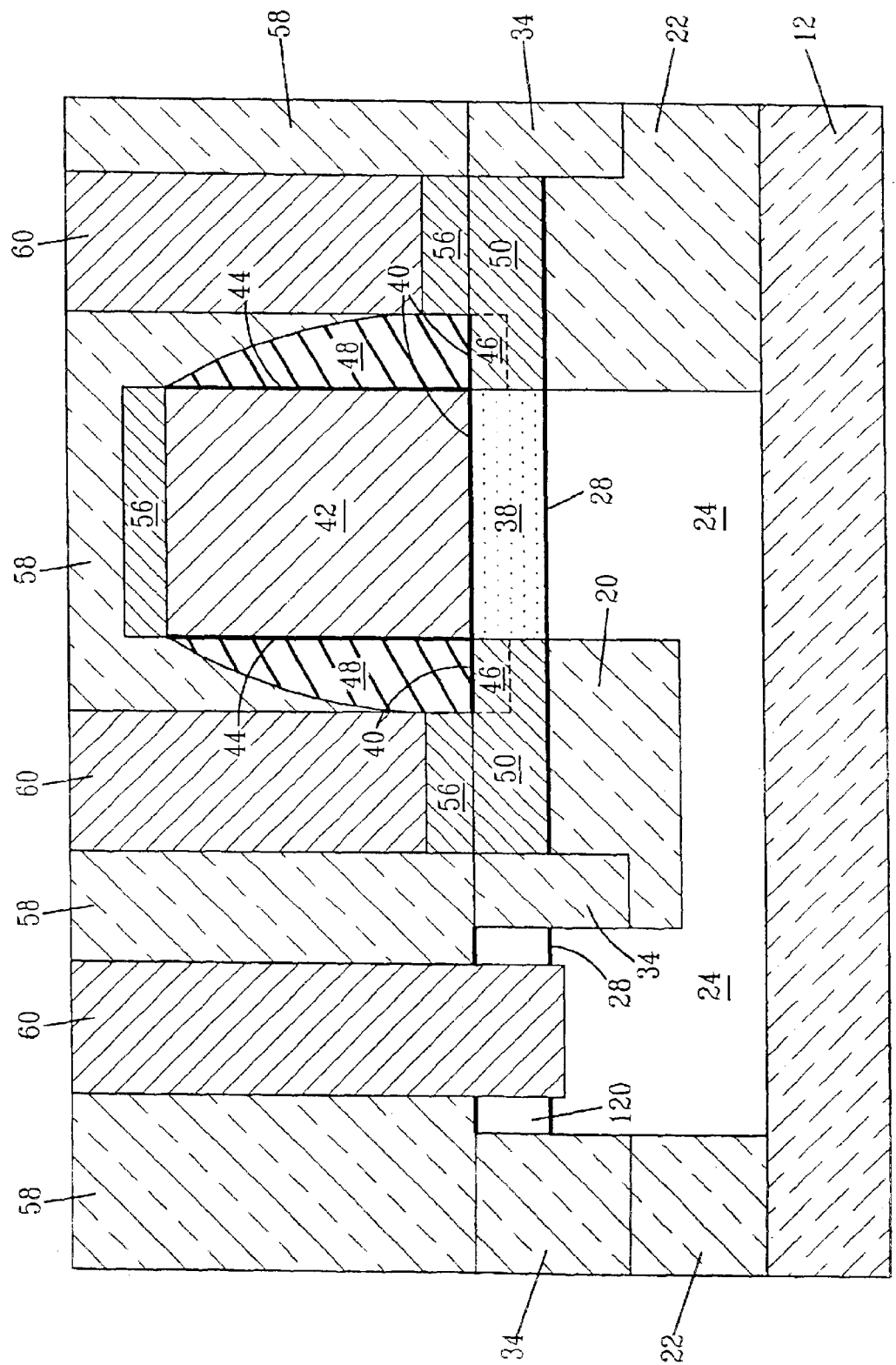

Next, and as shown in FIG. 15, conventional BEOL processing steps may be performed so as contact the device shown in FIG. 14 to external devices and/or other devices that may be present in the structure. Included in the BEOL processing steps is converting the raised source/drain regions and layer 54 atop the gate into silicide regions 56 by utilizing a conventional salicidation process; forming a layer of insulating material 58 such as BPSG (boron doped phosphorus silicate glass) by deposition and planarizing the same; providing contact openings into insulating layer 58 by lithography and etching; and filling the contact holes with conductive material 60. The conductive material employed includes, but is not limited to: Cu, Al, W, polysilicon and other like conductive materials. Note that the contact region which extends to the surface of the back-gate is the back-gate contact, while the contact regions which extend to the source/drain regions are referred to as S/D contacts.

In the structures shown in FIGS. 13, 14 and 15, implanted back-gate 24 is capable of controlling the threshold voltage of the front-gate, i.e., polysilicon gate 42, because the surface potentials at the front and back interfaces are strongly coupled to each other and capacitively coupled to the front and back-gate dielectrics, respectively. Therefore, the potential through the silicon film, and hence the charge, is determined by the bias conditions on both the front and back-gates. In other words, the implanted back-gate controls the threshold voltage of the front-gate device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

What is claimed is:

1. A silicon-on-insulator (SOI) metal oxide field effect transistor (MOSFET) device comprising:
    a silicon-on-insulator substrate comprising a first Si-containing layer located atop a buried oxide layer, said Si-containing layer including an N- or P-type dopant implanted back-gate region present therein;
    a second Si-containing layer located atop said first Si-containing layer, wherein a portion of the second Si-containing layer serves as a body region for a MOSFET;
    a gate dielectric located atop said body region; and a polysilicon gate located atop said gate dielectric, wherein said implanted back-gate region controls threshold voltage of said polysilicon gate.

2. The SOI MOSFET device of claim 1 wherein said first Si-containing layer includes shallow and deep trench isolation regions formed therein.

3. The SOI MOSFET device of claim 1 wherein said body region further includes source/drain regions and source/drain extension regions.

4. The SOI MOSFET device of claim 1 wherein said polysilicon gate includes spacers on sidewalls thereof.

5. The SOI MOSFET device of claim 1 further comprising raised source/drain regions located atop a portion of said body region.

6. The SOI MOSFET device of claim 1 further comprising suicide regions located atop a portion of said body region and atop the polysilicon gate.

7. The SOI MOSFET device of claim 1 further comprising a dielectric material located atop said second Si-containing layer as well as said polysilicon gate.

8. The SOI MOSFET device of claim 7 wherein said dielectric material includes conductive filled contact holes.

9. The SOI MOSFET device of claim 1 wherein said implanted back-gate serves as a threshold control system for the polysilicon gate.

* * * * *

UNITED STATES PATENT AND TRADEMARK OFFICE
CERTIFICATE OF CORRECTION

PATENT NO.    : 6,812,527 B2
DATED         : November 2, 2004
INVENTOR(S)   : Robert H. Dennard et al.

It is certified that error appears in the above-identified patent and that said Letters Patent is hereby corrected as shown below:

Column 5,
Line 64, "the cat invention" should read -- the present invention --

Column 10,
Line 2, "Suicide" should read -- silicide --

Signed and Sealed this

Twenty-fourth Day of May, 2005

JON W. DUDAS
*Director of the United States Patent and Trademark Office*